United States Patent [19]

Nightingale

[11] Patent Number: 4,607,394
[45] Date of Patent: Aug. 19, 1986

[54] SINGLE BALANCED PLANAR MIXER

[75] Inventor: Stephen J. Nightingale, Liverpool, N.Y.

[73] Assignee: General Electric Company, Syracuse, N.Y.

[21] Appl. No.: 708,002

[22] Filed: Mar. 4, 1985

[51] Int. Cl.$^4$ .............................................. H04B 1/26
[52] U.S. Cl. ..................................... 455/327; 455/330
[58] Field of Search ................................. 455/325–328, 455/330

[56] References Cited

U.S. PATENT DOCUMENTS

| | | | |
|---|---|---|---|
| 3,534,267 | 10/1970 | Hyltin | 455/327 |
| 4,211,977 | 7/1980 | Shinkawa et al. | 455/327 |
| 4,249,263 | 2/1981 | Shinkawa et al. | 455/327 |
| 4,450,584 | 5/1984 | Saka et al. | 455/325 |
| 4,553,266 | 11/1985 | Bates et al. | 455/327 |

Primary Examiner—Jin F. Ng
Attorney, Agent, or Firm—Richard V. Lang; Carl W. Baker; Fred Jacob

[57] ABSTRACT

A single balanced planar mixer is disclosed suitable for use in the reception of electromagnetic waves of extremely high frequencies including millimeter waves. The mixer may be combined with an antenna, the combination being particularly suitable for use in antenna arrays. The arrangement is planar combining coplanar strip, coplanar line, and microstrip transmission lines formed on an insulating substrate in a single balanced arrangement providing isolation between the antenna port on the one hand and the local oscillator and IF ports on the other hand. Additional filters suitable for fabrication on a substrate are employed to provide isolation between the local oscillator and intermediate frequency ports. At lower frequencies, the arrangement may be in a hybrid format using an insulating substrate and discrete diodes. At higher frequencies the arrangement may be monolithically integrated using a gallium arsenide substrate with integrated diodes.

12 Claims, 11 Drawing Figures

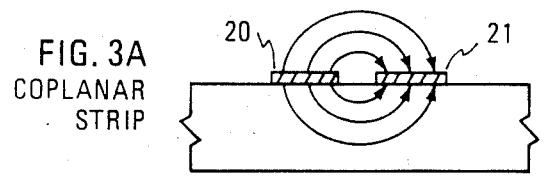
FIG. 3A
COPLANAR STRIP
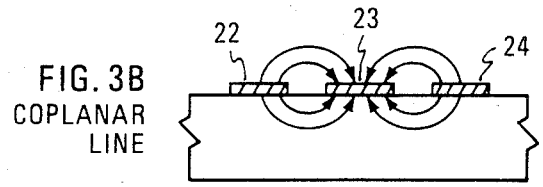
FIG. 3B
COPLANAR LINE
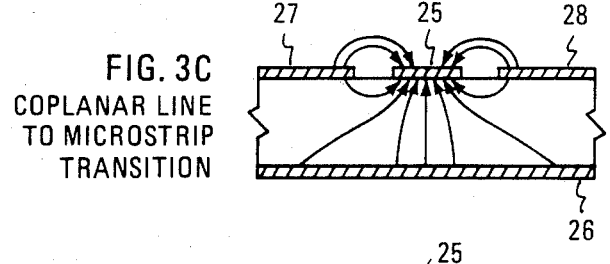
FIG. 3C
COPLANAR LINE TO MICROSTRIP TRANSITION
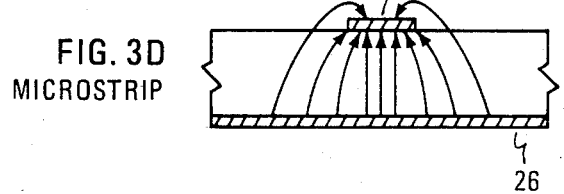
FIG. 3D
MICROSTRIP
FIG. 4
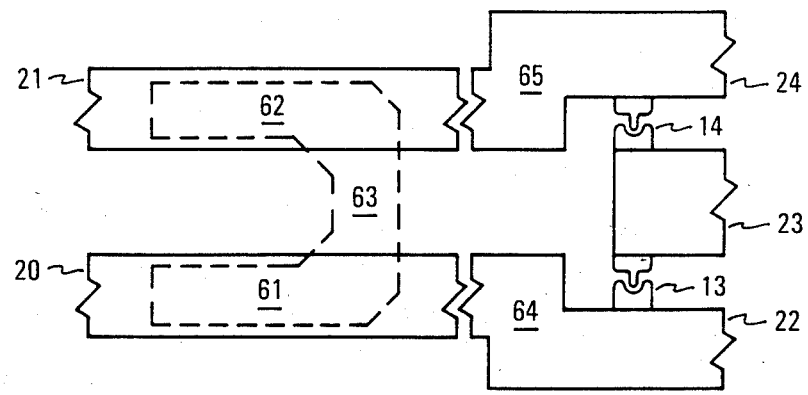

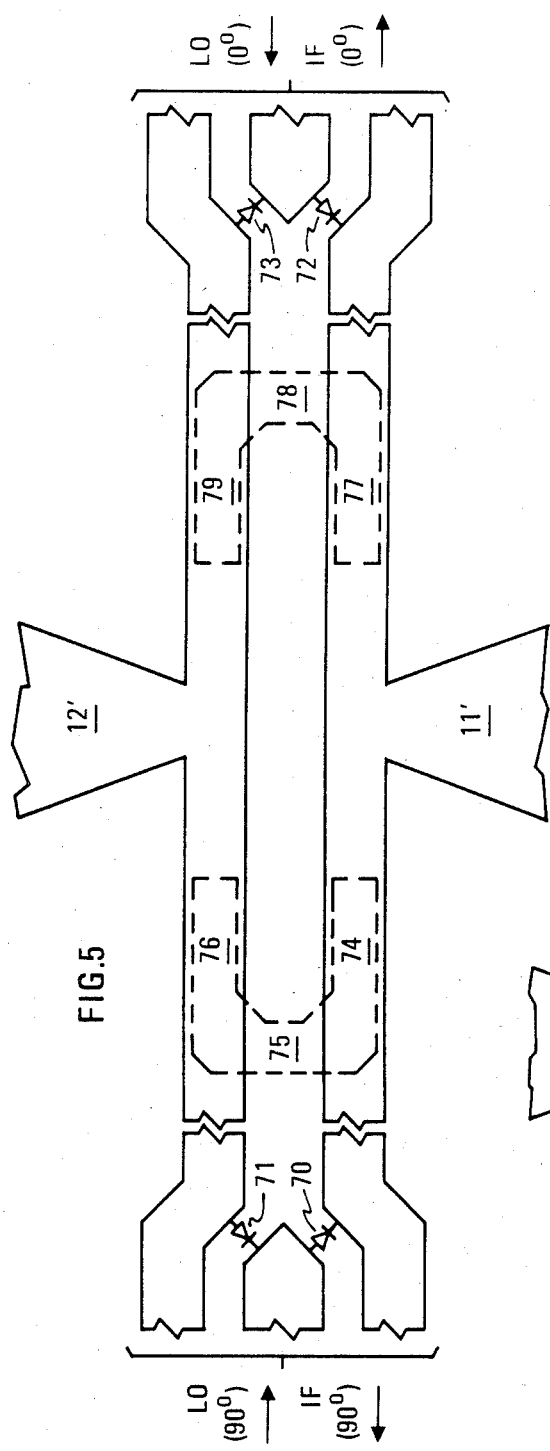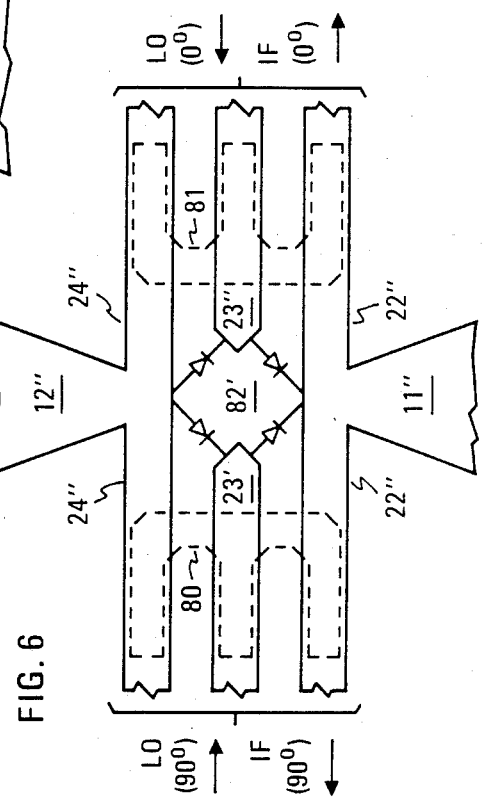

SINGLE BALANCED PLANAR MIXER

BACKGROUND OF THE INVENTION

1. Field of Invention

The invention relates to the reception of electromagnetic waves of high frequency including "Extremely High Frequency" (EHF) waves and to mixers and antennamixer combinations formed in a planar configuration which are suitable for use in antenna arrays at EHF and lower frequencies.

2. Description of Prior Art

The reception of waves at extremely high frequencies has required new fabrication techniques and new topologies. The need has arisen for topologies suitable to the range of frequencies which includes millimeter waves (typically 30 to 300 Gigahertz). However since the mixer conventionally changes the input signal waves to intermediate frequencies of a few Gigahertz, the topology must also be suitable to waves of a few Gigahertz. The most promising approach to high frequency circuit topology has been the extensive resort to planar topologies in which the transmission lines take the form of thin conductors patterned upon an insulating substrate by an automated process. At the higher frequencies, it has been proposed that the substrate itself be of a semiconductor material suited to the monolithic integration of both active and passive elements. Such monolithical assembly is particularly advantageous at the higher frequency ranges in simplifying connections. However it is less practical at the lower frequency ranges where the passive circuitry may require larger insulating substrates than are feasible in a semiconductor material. The "hybrid" format employing discrete active devices, is, accordingly, a practical form of the planar topology, when somewhat larger scaled circuitry is needed for lower frequency operation.

With the advent of interest in these frequencies, attention has been directed to performing the necessary circuit functions in the planar format. An example of an unbalanced transmission line in the planar format is the strip line in which a conductor of finite width is supported between two dielectric layers, spaced between upper and lower ground planes. The microstrip represents a simplification of a strip line in that only a single finite conductor, single ground plane, and a single dielectric layer are employed. A balanced planar line called a "coplanar strip" employs paired conductors patterned on the same substrate surface, and is electrically similar to twin line. An unbalanced line called coplanar line (sometimes referred to as coplanar waveguide) employs three conductors patterned on the same substrate surface comprising a center conductor and two finite width ground planes placed either side. Combinations of these transmission lines give promise of providing essentially all the functions previously achieved in waveguide arrangements including both filtering and balancing to provide mutually isolated ports.

SUMMARY OF THE INVENTION

Accordingly, it is an object of the invention to provide an improved planar mixer, single balanced for mutual isolation between the input signal port and the port employed for introducing local oscillations and deriving the intermediate frequency signal.

It is another object of the invention to provide an improved monolithic single balanced planar mixer.

It is still another object of the invention to provide a single balanced mixer suited to millimeter wave operation.

It is a further object of the invention to provide an improved combination monolithic single balanced mixer and antenna.

It is an additional object of the present invention to provide an improved combination mixer and antenna suitable for application to an array.

These and other objects of the invention are achieved in a novel single balanced planar mixer comprising an insulating substrate having an upper and lower surface suitable for supporting patterned conductors and electronic components, a first balanced two conductor transmission line of a coplanar strip design for propagating waves at input signal frequency, a second unbalanced coplanar transmission line for propagating waves at local oscillator and intermediate frequencies, transitioning to the first line, and comprising a third conductor spaced from the conductors of the first line at the transition, and two conductors to each side of the third conductor and transitioning in an electrically continuous path to the initial conductor pair, the latter conductor pair representing finite ground planes of the second transmission line.

The mixer further comprises a pair of diodes disposed at the transition between the first and second lines for converting the input signals to an intermediate frequency when local oscillator waves are coupled to the second line. The transition between the first balanced transmission line and the second, unbalanced transmission line, both supported in the upper surface of the substrate, blocks transmission of the input signal to the second line and blocks transmission of the intermediate frequency and local oscillator signals to the first line.

The mixer further comprises a third unbalanced transmission line of a microstrip design for propagating waves at local oscillator and intermediate frequencies, transitioning to the second transmission line, and comprising a further conductor supported on the upper surface of the substrate, electrically continuous with the third conductor, and a ground plane supported on the lower surface of the substrate extending to the second transition. A pair of resonant lines of microstrip design having an electrical length of one quarter wave length at the local oscillator frequency is provided to create low impedance connections at the local oscillator frequency between the finite ground plane conductors and the ground plane at the local oscillator frequency. Additional capacitive means may also be provided for a low impedance connection at the intermediate frequency. Finally, means are provided for coupling the third line to an input port for connection to a local oscillator and to an output port for connection to an intermediate frequency amplifier.

The length of the second transmission line is set at approximately $n\lambda/2$ where $\lambda$ is the wave length of the input signal and n equals 0, 1, 2 . . . to provide an open circuit at the plane of the diodes for minimum loading at the input signal frequency.

In accordance with a further aspect of the invention, a planar antenna is provided for reception of waves at signal frequency comprising a pair of conductors each of one quarter wavelength at the signal frequency arranged to form a half wave dipole antenna supported on the upper surface of the substrate and electrically connected to the first transmission line.

The substrate for higher frequencies is of a semiconductor material suitable for formation of active semiconductor devices such as gallium arsenide and the diodes are formed integrally therein.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1A being the principal drawing of the mixer; FIG. 1B being a first auxiliary drawing of greater scale illustrating the transmission line connections to the demodulating diodes of the mixer; and FIG. 1C being a second auxiliary drawing of greater scale illustrating the configuration of the band pass filter provided in the path between the local oscillator and the mixer;

FIGS. 3A, 3B, 3C and 3D illustrate the principal transmission lines of the mixer and the E fields characertisic of these transmission lines.

FIG. 4 is a variation of the FIG. 1 embodiment in which a sum filter is provided to enhance the efficiency of frequency conversion by reintroducing energy, otherwise lost, into the mixer; this energy occurring at the frequency of the sum of the signal and local oscillator frequencies;

FIG. 5 is an illustration of a mixer providing both image and sum energy recovery; and which while using a single dipole antenna incorporates a pair of mixer elements, one designed to operate with the reference and the other designed to operate with the quadrature phase of the local oscillator wave.

FIG. 6 is an illustration of a variation of the FIG. 5 mixer in which both image and sum energy recovery are provided, but in which the length of the coplanar strips is of minimum length.

DESCRIPTION OF THE PREFERRED EMBODIMENT

Figure 1A:
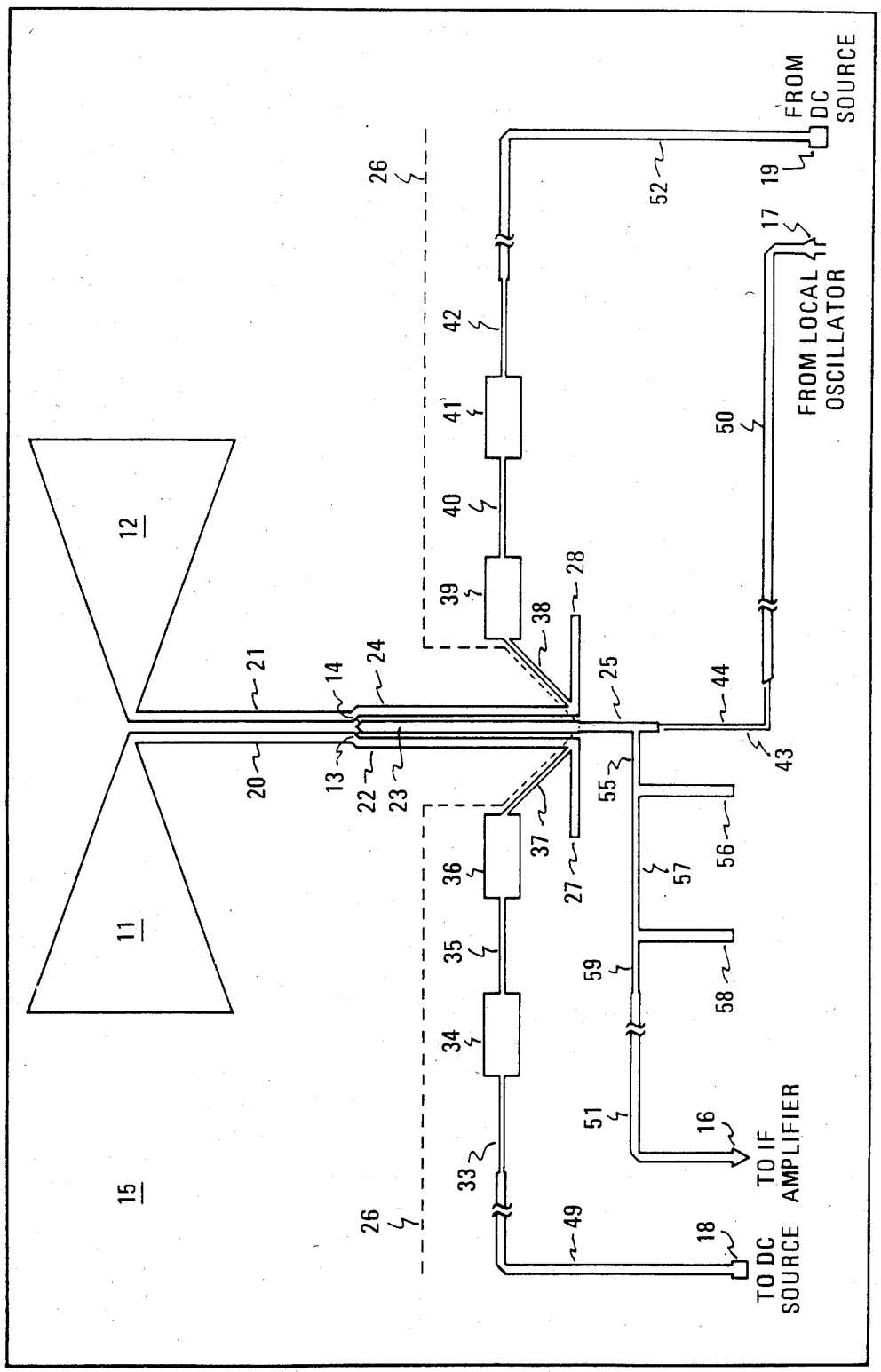
FIGS. 1A, 1B and 1C are plan views of a monolithic planar mixer embodying the invention, particularly suited to operation at extremely high frequencies (EHF) or millimeter waves.

Referring now to FIG. 1A, a novel planar mixer in accordance with the present invention is shown. The mixer is designed to operate at "extremely high frequencies" (EHF) or "millimeter waves". These ranges are typically from 30 to 300 GHz. Operation however may be substantially below these frequencies in a hybrid or nonmonolithic embodiment in which the active circuit elements (such as the diodes) are discrete rather than formed in the substrate.

Figure 1B:
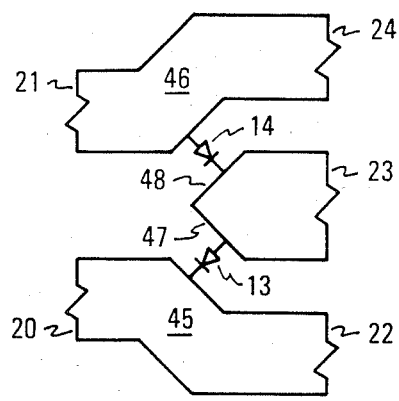
Figure 1C:
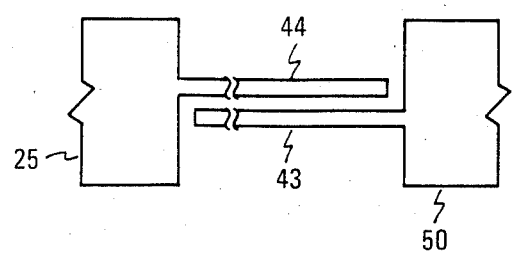

In the embodiment illustrated in FIGS. 1A thru 1C, the mixer is of a monolithic design which incorporates a dipole antenna 11, 12 for receiving the remote signal, integrated active semiconductor components (diodes 13, 14), and the essential passive filter components, all of which are formed in or upon a common substrate 15 of gallium arsenide (GaAs).

Generally, active silicon and germanium devices are not used for operation at frequencies substantially above 10 GHz except in special applications, but other compound semiconductors may be useful at these frequencies. At lower frequencies, the active circuitry of the mixer may still be integrated into a monolithic configuration, but the cost of expanding substrate size may require removal of the antenna and a redesign of the filters. The antenna illustrated must be about one half wave length at the operating frequency for reasonable gain. Assuming upper limits on practical chip size of one centimeter, the lower frequency limit on a mixer integrating the antenna, based on chip size, may be about 15 GHz. Assuming a nonintegrated antenna, operation at lower frequencies may also require substituting lumped filter elements for distributed filter elements. At these lower frequencies, the mixer may be constructed in the conventional hybrid configuration, wherein the passive elements are formed on an insulating substrate and the active elements are discrete. Suitable dielectric materials for such a substrate include alumina, beryllia, polytetrafluoroethylene (PTFE), quartz, etc.

Referring now to the monolithic planar mixer illustrated in FIG. 1A, it may be seen to comprise a bowtie dipole antenna 11, 12 for reception of a remote signal at EHF frequencies, an input port 17 for acceptance of local high frequency oscillator waves for heterodyning with the remote signal, and an output port 16 for coupling the intermediate frequency signal obtained in the mixer to subsequent utilization apparatus. Depending upon the mixer requirements and upon available substrate area, additional circuitry such as that of the local oscillator and of the intermediate frequency amplifier may be added to the common substrate. Finally, DC terminals 18 and 19 are provided for applying suitable DC bias to the mixer diodes 13, 14. All of the components and the ports/terminals are formed upon the GaAs substrate 15.

The mixer further comprises a first electromagnetic wave transmission line 20, 21, for coupling the signal from the antenna to the diodes 13, 14, a second electromagnetic wave transmission line 22, 23, 24 for propagating waves at the local oscillator and intermediate frequencies to and from the diodes, respectively, and a third electromagnetic wave transmission line 25, 26 coupled to the second line for propagating incoming waves at the local oscillator frequencies received via a suitable filter from the port 17, and outgoing waves at the intermediate frequency for transmission via a suitable filter to the port 16. The transition from the second to the third transmission line includes a pair of quarter wave matching stubs 27, 28. The mixer further includes a high pass filter 43, 44 for isolating the local oscillator coupled between the third transmission line and the line 50 to the local oscillator input port 17; and a low pass filter 55-59 for blocking all signals above intermediate frequency coupled between the third transmission line and the line 51 to the IF output port 16. In addition, a low pass filter 33-37 for rejecting all high frequency waves is provided in the path between diode 13 and the line 49 to the pad 18 for a first DC source. Similarly a low pass filter 38-42 for rejecting all high frequency waves is provided in the path leading from a second DC source, coupled via the pad 19, and line 52 to the diode 14. The DC sources provided a desired potential difference between the pads 18 and 19. The bias connections place the diodes 13 and 14 electrically in series for DC current, as more fully described below.

As shown in FIGS. 1A-1C, the mixer is of a planar design in which all of the circuitry, including the antenna and the transmission lines, are formed on the planar surfaces of these substrates. The arrangement is coplanar in that it is formed on one surface of the substrate from the antenna through the mixer diodes. The dipole antenna is formed of two metallizations 11 and 12 respectively, in a "bowtie" configuration arranged over a portion of the substrate whose lower surface is free of the ground plane (26). The bowtie has the length of approximately 3,000 microns, a width of 1,800 microns and a central angle of 40°, suiting the antenna for broadband operation in the vicinity of 30 GHz.

The transmission line coupled to the bowtie antenna, is of the "coplanar strip" design having a 100 ohm characteristic impedance selected to match the impedance of the bowtie antenna. The transmission line is coplanar in that it is formed of two conductors 20, 21 which are metallizations formed on the upper surface of the substrate. The adjacent lower surface of the substrate is without a ground plane. The conductors 20, 21, are each 73 microns wide and are spaced 100 microns apart, causing the axis of the transmission line to fall midway between the metallizations (20, 21). The coplanar strip 20, 21 is designed for balanced operation and propagates waves in a quasi TEM mode, in which the E field configurations are as shown in FIG. 3A.

The end of the first transmisstion lines remote from the antenna 11, 12 is connected by means of a transition to the second transmission line 22, 23, 24. The two lines are arranged axis to axis, with both axes in alignment. The detector diodes 13, 14 are placed at this transition. As shown in FIG. 3B, the second transmission line is an unbalanced line designed to carry the waves at local oscillator frequency to the detector diodes in a right to left direction (using the orientations of FIG. 1A) and to carry away the waves at intermediate frequency from left to right toward the IF output port 16. The second transmission line consists of three conductors, the outer conductors 22, 24 of which are 70 microns wide, each spaced 50 microns from the central conductor 23, 100 microns wide. The configuration is designed to have a characteristic impedance of 50 ohms. The coplanar line 22, 23, 24 is designed for unbalanced operation with the outer conductors 22, 24 being finite width ground planes. The line propagates waves in a quasi TEM mode in which the E field configurations are as illustrated in FIG. 3B.

The transition between the first and second transmission lines and the siting of the diodes 13, 14 is best illustrated in FIG. 1B. The conductor 20 of the first transmission line transitions via a line segment 45 disposed at a 45° angle to the transmission line axis into the conductor 22 of the second transmission line. Similarly, the conductor 21 transitions via a line segment 46 disposed at a 45° angle to the axis of the transmission line into the conductor 24 of the second transmission line. The central conductor 23 of the second transmission line starts in the transition region with a pointed end, whose leading edges 47, 48 are spaced from and aligned parallel to the line segments 45 and 46 respectively. The pointed end of the conductor 23 has a central angle of 90°.

The diodes 13 and 14, which are illustrated symbolicly at 13, 14, make connection respectively between the transitional segments 45 and the edge 47 of the central conductor 23, and the transitional segment 46 and the edge 48 of the central conductor 23. The cathode of diode 13 is connected via the line segment 45, the conductor 22 of the second transmission line, the filter elements 37-33, and line 49 to the pad 18. The anode of diode 13 is connected via the conductor 23 of the second transmission line to the cathode of the diode 14. The anode of the diode 14 is connected via the line segment 46, the conductor 24 of the second transmission line, the low pass filter 38-42 and line 52 to the pad 19. Thus the diodes are serially connected between two sources having the desired DC potential difference for optimum mixer efficiency. The diodes polarity may be reversed if the polarity of the DC supply is reversed.

The coplanar transmission line 22, 23 and 24 is designed to carry waves of local oscillator and IF frequency to and from the detection sites respectively. The wave propagation in the line 22, 23, 24 is in the quasi TEM mode as illustrated in FIG. 3B. The electrical length of the coplanar line (22, 23, 24), should be an integral multiple of half waves at the signal frequency (i.e. $n\lambda/2$ where $n=0, 1, 2$, etc.). The zero value may be satisfied by making the length of the transmission line a relatively few (<10) electrical degrees. A preferred electrical length is one half wave length. Thus the two "slot lines" 22-23 and 23-24 formed in the coplanar line will present an open circuit plane at the diode to waves of signal frequency thereby providing minimum loading across the diodes to ensure efficient energy conversion. In the example, so far described, designed for 30 GHz operation, the length of the line is approximately 1,900 microns measured from the transitions 45, 46 to the base of the quarter wave shorting stubs 27, 28. The characteristic impedance of the coplanar line is 50 ohms.

The transition between the first transmission line 20, 21 and the second transmission line 22, 23 occurring at the mixing sites, is designed to minimize undesired feedthrough. In particular, direct feedthrough of the antenna signal into the local oscillator and IF amplifiers and feedthrough of the local oscillator output and IF frequency signal into the antenna are minimized. At the transition between the first transmission line 20, 21 and the second transmission line 22, 23, 24, a change occurs from a "balanced" line, (where both members 20 and 21 are alternately of above and below ground potential in a mutually opposite sense) to an "unbalanced line" (in which the outer conductors 22 and 24 of the second transmission line share the same phase forming virtual, but finite elements of a common ground plane, while the central conductor 23 is alternately above and below ground potential with respect to 22 and 24). The E fields at the transition are as shown in FIG. 3C.

Cancellation of the antenna signal in the IF amplifier (or local oscillator) occurs in the following manner. The conductors 20, 21 of the first transmission line are driven in mutually opposite phases by the separate dipoles 11 and 12 of the antenna. After the transition to the second transmission line, the opposite phases propagate separately in the conductors 22 and 24 until they are combined at the junction of the transmitter lines 23 and 25. The combination, causes a substantial cancellation of the antenna signal at the junction of conductors 23 and 25. By reciprocity, since the network is passive, the local oscillator or intermediate frequencies are also isolated from the signal input. The mode of operation of this part of the circuit is similar to a rectangular waveguide magic tee.

While the analysis assumes that the diodes 13, 14 are absent, the cancellation remains excellent and feedthrough in either direction through the transition is minimized by this design.

As indicated above, the local oscillator 17 supplies waves to the microstrip line 50 (formed over the ground plane 26) which are filtered in 43, 44 (over 26) and coupled to the microstrip 25 (also over 26) which in turn transitions to the second transmission line, the coplanar line 22, 23, 24. Thus, the local oscillator waves proceed via the microstrip section 25 (26), via the filters 55–59 (26), the microstrip 51 (26) to the output port 16. The transition between the second transmission line (22, 23, 24) and the third transmission line (25, 26) should produce minimum reflections to both the IF waves passing through the transition to the IF amplifier and to local oscillator waves passing through the transition to the diodes.

The microstrip lines, of which 25, 26 and 50, 26 are examples, are planar lines having a one conductor on the upper surface of the substrate and another on the undersurface. These lines are designed for unbalanced operation with the conductor on the upper surface (25) being of finite width and the conductor on the other surface being in principle of infinite width and forming a ground plane. The propagation due to the asymmetry of the design is not TEM in nature. The E fields in a microstrip line are as illustrated in FIG. 3D.

The transition between the second transmission line 22, 23, 24, and the third transmission line 25, 26 is made reflectionless to waves passing either up or down by the following measures. The coplanar line 22, 23, 24 and the microstrip line 25, 26 are both designed to have the same characteristic impedance (50 ohms). Recognizing that there is continuity between the conductors 23 and 25 on the upper surface of the substrate, the transition between the two lines could be completed by a through connection of the ground plane conductors 22, 24 on the upper surface of the substrate to the underlying ground plane. As shown by the dotted outline in FIG. 1A, the ground plane 26 exists on the undersurface of the substrate under the microstrip circuitry. The disadvantage of the through connection is that it does not allow DC bias to be applied to the diodes. A low impedance path for the LO waves between the ground planes to facilitate a low loss transition is better achieved by the use of two quarter wave, open circuit, microstrip stubs 27, 26; 28, 26. The stubs are disposed on the upper surface of the substrate over the underlying ground plane 26, with the stub conductors 27, 28 being connected to each ground plane conductor 22, 24 of the coplanar line. The construction provides a connection of the upper ground plane conductors 22, 24 to the lower ground plane 26 and completes a low loss transition for waves at LO frequencies going upward from the microstrip to the mixer diodes.

The operation of the transition for LO waves may be further explained by reference to FIGS. 3D, 3C and 3B in that order. Viewed from the LO side of the transition, the ungrounded conductor 25 and ground plane 26 propagates waves upwardly with the E field configuration shown in FIG. 3D. Briefly, FIG. 3D shows the field concentration beneath the microstrip conductor 25. At the transition illustrated in FIG. 3C, the field region divides being reduced underneath and increased to the sides of the microstrip conductor 25 as the field is being established with the upper coplanar conductors (here the stubs 27, 28).

The stubs, which are a quarter wave length at LO frequency, present a short circuit between the conductor pairs 27, 26 and 28, 26. Thus a virtual generator of LO waves connected between the conductors 25, 26, "sees" a short circuit between 26 and 28 and between 26 and 27 and the field transitions from the space between conductors 25, 26 to the spaces between 25, 27 and 25, 28 as desired. Beyond the transition, the ground plane terminates, and the stubs 27, 28 transition to the finite ground plane conductors 22, 24 of the coplanar line. This allows the fields to be fully transitioned into the lateral spaces 22, 23 and 23, 24 appropriate to the coplanar line.

The transition between the coplanar lines 22, 23, 24 and the microstrip 25, 26 must also provide a low loss path to waves of intermediate frequency appearing at the diodes 13, 14 and propagating down the transmission lines to the IF amplifier. The IF is typically smaller than the signal or LO frequency by one or two orders of magnitude. With a lower IF, the continuity between the finite ground planes 22, 24 and the underlying ground plane 26 may be accomplished by the provision of an appropriate capacity. At a higher IF, e.g. 2 GHz, with the LO and signal frequencies being higher (the capacity between the stubs 27, 28, which are relatively wide) having a characteristic impedance of 30 ohms (and having a length of 892 microns) are adequate to provide the requisite capacity. At lower intermediate frequencies, the presence of the large area filter sections (36, 39) isolated by high impedance paths, which are electrically short at longer wave length, may be quite adequate. Otherwise capacitors specifically introduced for the purpose may be provided.

Figure 2:
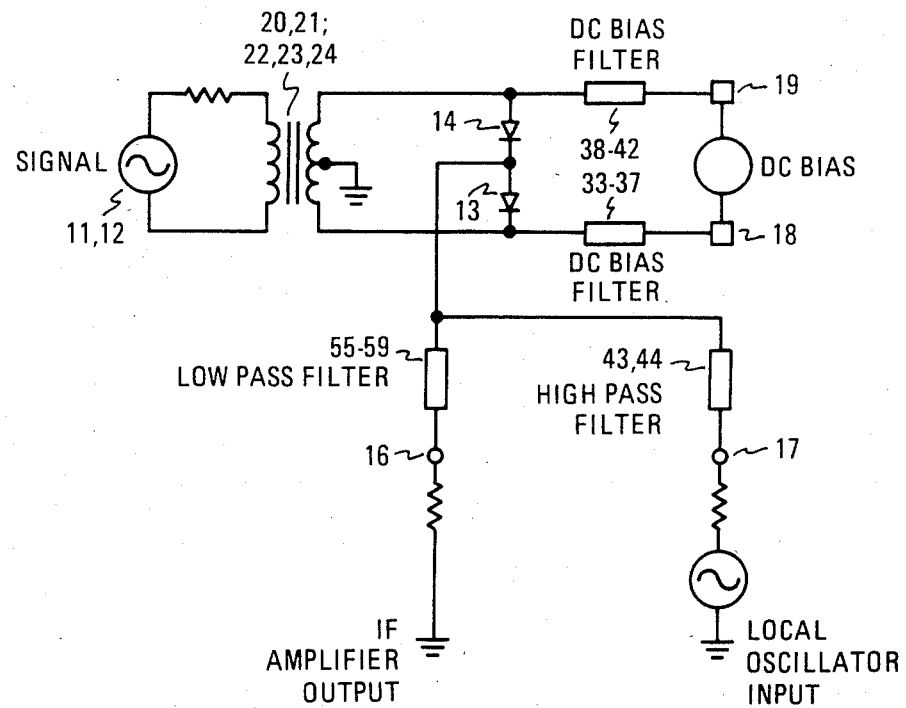
FIG. 2 is an equivalent circuit representation of the mixer of FIGS. 1A to 1C.

The mixer may be equivalently represented as being comprised of several lumped circuit components in the manner illustrated in FIG. 2. The antenna 11, 12 may be represented as an AC signal generator supplying an electrical voltage via a load to the primary winding of a transformer, the transformer having a center tapped secondary. The coplanar strip 20, 21 is equivalently represented to be the primary of the transformer and the coplanar line 22, 23, 24 is equivalently represented by the center tapped secondary of the transformer. The series connected diodes are connected across the ungrounded taps of the transformer secondary and the center tap of the secondary is grounded. DC bias to the diodes is provided by means of a source of DC bias represented as connected between the pads 18 and 19. The DC bias path comprises the pad 18, the microstrip sections 38–42 represented as a first low pass DC bias filter, diode 14, diode 13 and the microstrip sections (33–27) represented as a second low pass DC bias filter, returning to pad 19, and completing the path. The local oscillator input connection 17 is coupled via the microstrip lines 43, 44 (represented as a high pass filter) to the connection between diode 14 and diode 13. The IF output appearing at that connection is coupled via the microstrip sections 55–59 (represented as a low pass filter) to the IF output connection 16.

The equivalent circuit of FIG. 2 is an approximate representation of the essential functional components of the mixer. The filters will now be individually discussed.

The low pass DC bias filters 38–42 and 33–37, are of the same design and each consists of three 90 ohm and two 20 ohm sections, each a quarter wave length long at the local oscillator frequency. The design yields an insertion loss of 25 db at the signal and local oscillator frequencies. (This circuit configuration does not permit the IF signal to flow out through the DC bias filters.) The filter connection to the diodes is provided by the high impedance microstrip lines 37, 38. These lines are arranged over the lower ground plane 26 and make connection to the principal conductors of the coplanar line and to the stubs at their junction. The path of the connection is oriented 45° to these elements to provide minimum interference and coupling with either. The last filter sections (33 and 42) lead via 50 ohm microstrip lines (49, 52) to the pads 18 and 19 respectively.

The high pass filter of the local oscillator is designed to allow the local oscillator signal to be propagated into the microstrip 25, 26 via the coplanar line 22, 23, 24 to the diodes 13, 14 while at the same time both DC and intermediate frequency waves are prevented from entering the LO circuitry. The local oscillator is connected at 17 via a 50 ohm microstrip line 50, 26 to one end terminal of the filter 43, 44, 26 via a 50 ohm microstrip line 50, 26. The other terminal of the filter 43, 44, 26, which exhibits a 50 ohm impedance is connected to the microstrip line 25, 26 which also exhibits a 50 ohm impedance.

The construction of the local oscillator high pass filter is illustrated in FIG. 1C. The filter 43, 44, 26 consists of two open circuit quarter wave lines arranged over the ground plane 26 and mutually closely coupled. Thus the capacitive coupling provides a block to DC. The selection of width and spacing at the coupled lines optimizes coupling of the local oscillator output to the diodes 13, 14. The design minimizes feedthrough into the local oscillator of IF frequencies which are substantially lower than the local oscillator frequencies.

The filter (55–59, 26) for the intermediate frequency amplifier is designed to allow the intermediate frequency signal to pass to the IF connection 16 while rejecting the antenna signal, local oscillator and other mixed produce frequencies. The filter is a low pass structure which allows the mixer to be operated with an IF which may extend down to zero (DC). This suits the design to use as a mixer in a doppler system requiring low intermediate frequencies or as a phase detector. The input terminal of the filter is connected to the microstrip 25, 26 which is a 50 ohm line and the filter (which is designed to match a 50 ohm impedance) has its other terminal connected via a 50 ohm microstrip line 51, 26 to the IF output connection 16.

The low pass filter consists of a succession of three 90 ohm lines 55, 57, 29 interconnecting two resonant stubs, each having a 30 ohm characteristic impedance. The alternating line-stub-line configuration provides a low pass attenuation of greater than 30 db from 27–33 GHz thus preventing signal and local oscillator from reaching the IF output.

A second embodiment of the mixer is illustrated in FIG. 4. In FIG. 4, a filter is provided in the strip line between the antenna and the diodes 13, 14 for the purpose of enhancing the efficiency of frequency conversion. The filter consists of a metallization applied to the undersurface of the substrate 15, consisting of three approximately linear segments 61, 62, 63, arranged in a U-shaped configuration. The line segments 61, 62 are positioned adjacent one another on the undersurface of the substrate 15, each segment disposed in parallel alignment beneath one of the conductors 20, 21 of the strip line. The segments 61, 62 are one quarter wave length long at the sum frequency which, for low IFs, corresponds to approximately one-eighth wave length at the signal frequency. The ends of the two line segments nearer the diodes are connected together. The arrangement provides a short circuit across the slot at the sum frequency causing a reflection of sum frequency energy back to the diodes. The short circuit plane is adjusted to minimize conversion loss and the noise figure.

In the embodiment of FIG. 4, the outline of mixer diodes at the transition is illustrated. The diodes are disposed at the transition between the coplanar strip 20, 21 and the coplanar lines 22, 23, 24, but the transition is now of a stepped design. In the stepped design, the outer conductors 20, 21 of the coplanar strip transition via orthogonal line segments 64, 65 to the outer conductors 22, 24 of the coplanar line. Consistently, the line segment 24 has a rectangular end which is spaced from the plane of the steps 64, 65. The diodes are then fabricated between adjacent surfaces of the conductors 22, 23 and 23, 24 in a perpendicular opientation to the axis of the lines. This orientation simplifies the diode fabrication, by making it easier to align the anodes during contact lithography.

A third embodiment of the mixer is illustrated in FIG. 5 in which both image and sum energy are recovered. In the full arrangement, which is only partially depicted in FIG. 5, a single dipole antenna 10', 11' is used to supply the signal to a first mixer operating at reference phase and a second mixer which is operating at quadrature phase. The mixer at quadrature phase includes the diodes 70, 21 arranged at the transition between the coplanar strip and the coplanar lines to the left in the illustration. It should be understood that the quadrature mixer configuration continues past the left break and replicates the mixer configuration illustrated in FIG. 1A. A second mixer at reference phase is provided to the right in the illustration, the second mixer includes the diodes 72, 73 connected at the transition between the coplanar strip and the coplanar line. The reference phase mixer configuration continues to the right past the right break and also replicates the mixer configuration illustrated in FIG. 1A.

The design of FIG. 5 (neglecting the sum filters) permits recovery of energy created at the image frequency in the mixers. The mixer diodes 70, 71 and 72, 73 are supplied with local oscillations at reference and quadrature phase provided from a common oscillator, feeding the mixers through a reactive tee providing equal signal path lengths. In operation, the mixer diodes 70, 71 produce a first IF output signal proceeding to the left and the mixer diodes 72, 73 produce a second IF output signal preceeding to the right. The two IF signals are then combined vectorily to obtain a combined output signal resulting in an approximate 2 db gain in conversion efficiency.

The FIG. 5 arrangement is additionally provided with filters 74, 75, 76 reflecting energy to the diodes 70, 71 to the left and a filter 77, 78, 79 reflecting energy to the diodes 72, 73 to the right. These filters are of the same design illustrated in FIG. 4 and enhance the conversion efficiency of the mixing process.

The arrangement of FIG. 5 may also be further modified as illustrated somewhat schematically in FIG. 6. FIG. 6 illustrates an arrangement functionally similar to the FIG. 5 arrangement in that both image and sum energy is recovered but differs from the prior arrangements by the direct transition of the bowtie antenna to the coplanar lines. In this design the antenna dipoles 11", 12" are shown supplying energy at a short transition from coplanar strip to coplanar line. More particularly, the dipole 11" is shown connected to an outer conductor 22" which extends both to the right and to the left of the antenna connection. The dipole 12" is similarly connected to an outer conductor 24" which also extends to the right and to the left of the dipole connection. The diodes are illustrated schematically arranged in a bridge configuration 82' with the cathodes of two diodes being connected to the conductor 24" and the anodes of two diodes being connected to the conductors 22". A central conductor, bearing a reference number 23', extends to the left and bearing a reference number 23" extend to the left of the antenna connection. The conductor 23' is connected between cathode and anode of the left diode string and the conductor 23" is connected between cathode and anode of the second diode string. The arrangement as so far described is designed to operate the diodes to the left in quadrature phase with respect to the diode pair to the right as in the FIG. 5 arrangement. The transition from antenna to the short coplanar strip is relatively efficient and produces a good energy transfer. A sum frequency recovery filter is provided for each diode pair in the FIG. 6 arrangement. The sum filter 80 is associated with a diode pair to the left in the illustration and the filter 81 is associated with the diodes to the right in the illustration. The energy at the sum frequency which is created in the diodes, must be reflected back to the diodes if it is to be conserved. With the diodes, and the filters, outwardly disposed in the FIG. 5 arrangement, the filters must be arranged with their vertical shorting bars inward facing the diodes.

The diodes selection and biasing should be optimized for the frequency band of operation and for the application. At the higher (EHF) frequency bands in which a monolithic construction is employed, the diodes may be either Schottky or Mott diodes. In these circuits optimum signal mixing efficiency will ordinarily be achieved by optimizing the forward DC bias on each diode. The Mott diode frequently requires less local oscillator power for a given noise figure than the Schottky diode and may be preferable in space applications, where local oscillator power is relatively expensive to provide.

The mixer may be used with other signal sources than the one depicted. The bowtie antenna may be installed in a waveguide as an efficient means for coupling the mixer to energy available within a waveguide. If the antenna is intended for reception of a free space signal, the gain of the antenna may be enhanced by the provision of a reflecting conductive plane suitably spaced provided below the substrate. In this configuration, the pattern of the antenna will be broadside to the top face of the substrate. For an end fire pattern, the bowtie may be replaced by a succession of dipoles in the plane of the substrate in a Yagi design. Should more gain be desired than is achievable by single units, clusters of mixer units may be arranged in an array. If the arrangement uses an end fire configuration, the antenna cross section may be very efficient with the radiating elements themselves filling the cross section of the array and the mixer electronics largely being arranged behind the receiving elements.

The mixer is of a design in which two ports, for example the local oscillator and the signal ports, are mutually isolated as a result of a single balanced wave transmission line geometry. (In a double balanced design, not present here, mutual isolation would have been achieved between three ports.) In a single balanced design, the isolation between the local oscillator and the signal (and the isolation between the IF and the signal) is due to this balance. This isolation is attributable to the balanced line (20, 21) which transitions to the unbalanced line (22, 23, 24) (and vice versa coupled between the signal port on one hand and the IF and LO ports on the other hand. The coplanar strip 20, 21 and the coplanar line 22, 23, 24 both propagate quasi TEM waves with substantial transverse symmetry, whereas a conventional slot line with its non-planar conductors does not, a factor which enhances the quality of the isolation produced. In the coplanar line 22, 23, 24 reduced ground planes 22, 24 were necessary to reduce RF leakage and enable the application of a DC bias.

Additional isolation at the IF amplifier port is achieved by the low pass filter 55-59 in the IF output which blocks the oscillator frequency and mixed product terms such as (LO+SIG) and (2LO−SIG). The local oscillator port is isolated by the high pass filter 43, 44 which blocks both the DC and the IF.

The balanced mixer of the present invention is particularly efficient at the higher frequencies due to its coplanar design. Assuming that the diodes (e.g. Schottky or Mott) are formed directly onto the substrate, their contacts are on the same side of the substrate suiting them for coplanar diode connections. Consistently, the input line from the antenna to the diodes is a "coplanar strip", (20, 20) which transitions to the coplanar line (22-24) from the diodes, all of whose conductors are on the top surface of the substrate. Coplanarity provides lower inductance effects than microstrip, in which the fields are established through the thickness of the substrate, and permits high impedance lines to be realized without the high losses of microstrip. After conversion to the intermediate frequency, the microstrip is appropriate.

A TEM wave is one in which the E field, H Field and direction of propagation are mutually orthogonal. Strictly speaking a pure TEM wave can only exist between conductors in a homogeneous dielectric medium. In a non-homogeneous dielectric medium such as microstrip and coplanar lines some energy is propagated in other modes, but the majority propagates similarly to a TEM wave hence the description quasi TEM propagation. Furthermore TEM or quasi TEM propagation can only occur when the conductor widths and spacings are small fractions (<1/10) of a wavelength at the frequency of the propagating wave.

In principle, it is not essential that the transmission lines in the described configuration be designed for quasi TEM propagation provided a DC bias can be developed across the diodes. However in the described configuration it is necessary to keep the overall width of the coplanar strip feed (20, 21) to the antenna relatively narrow so as to avoid unnecessary aperture blockage. It is also necessary to restrict the width of the ground planes of the coplanar line (22, 23, 24) in order to be able to achieve an adequate RF short circuit by the stubs (27, 28) at the transition between the microstrip 25, 26 and the coplanar line.

What is claimed is:
1. A single balanced planar mixer comprising
A. an insulating substrate having an upper and lower surface suitable for supporting patterned conductors and electronic components;
B. a first balanced transmission line of a coplanar strip design for propagating waves at input signal frequency, comprising first and second conductors supported on said upper surface;
C. a second unbalanced coplanar transmission line for propagating waves at local oscillator and intermediate frequencies, transitioning to said first line, and comprising:

a third conductor supported on said upper surface and positioned along the axis of said first line but spaced from the conductors of said first line at said transition; and fourth and fifth conductors supported on said upper surface to each side of said third conductor and transitioning in an electrically continuous path to said first and second conductors respectively;

said fourth and fifth conductors representing finite ground planes of said second transmission line;

D. a pair of diodes disposed at the transition between said first and second lines, one diode being coupled between said third conductor and the transition between the first and fourth conductor and the other diode being connected between said third conductor and the transition between the second and fifth conductor, said diodes converting said input waves to an intermediate frequency when local oscillator waves are coupled to said second line;

said transition between said first, balanced transmission line and said second, unbalanced transmission line blocking transmission of the input signal to said second line and the intermediate frequency and local oscillator signals to said first line;

E. a third unbalanced transmission line of a microstrip design for propagating waves at local oscillator and intermediate frequencies, transitioning to said second transmission line, said third transmission line comprising
a sixth conductor of finite width supported on said upper surface, electrically continuous with said third conductor, and a seventh conductor supported on said lower surface to form a ground plane under said sixth conductor; and F. a pair of resonant lines of microstrip design having an electrical length of one quarter wave length at the local oscillator frequency, positioned at the transition between said second and third lines to create low impedance connections at the local oscillator frequency between said finite ground plane conductors of said second transmission line with the ground plane of said third transmission line at the local oscillator frequency, and G. means providing capacitance between said finite ground plane conductors and said ground plane to provide low impedance connections at said intermediate frequency, and H. means for coupling said third line to an input port for connection to a local oscillator and to an output port for connection to an intermediate frequency amplifier.

2. A planar mixer set forth in claim 1 wherein the capacitance of said means referred to in paragraph G is at least in part provided by said resonant lines referred in paragraph F.

3. A planar mixer set forth in claim 1 wherein
the length of said second transmission line is set at approximately $n\lambda/2$, where $\lambda$ is the wave length of said input signal and n equals 0, 1, 2 . . . to provide an open circuit at the plane of the diodes.

4. The planar mixer set forth in claim 3 further comprising a planar antenna is provided for reception of waves at signal frequency comprising a seventh and an eighth conductor each of one quarter wave length at the signal frequency arranged to form a half wave dipole antenna, said seventh and eighth conductors being supported on said upper surface and electrically connected to said first and said second conductors respectively.

5. The planar mixer set forth in claim 4 further comprising means for coupling said diodes to a first and a second terminal for connection to DC biasing means for facilitating efficient mixer operation.

6. The planar mixer set forth in claim 5 wherein said coupling means comprises a pair of low pass filters having a cut off frequency set to reject input signal, local oscillator, and intermediate frequencies, each filter being connected between one of said terminals and one electrode of one diode to complete a series path establishing through said diode pair for biasing.

7. The planar mixer set forth in claim 6 wherein
the capacitance of said means referred to in paragraph G is at least in part provided by said low pass filters.

8. The planar mixer set forth in claim 3 wherein
said intermediate frequency is made substantially lower than the frequency of said input signal and local oscillator frequencies and having in addition thereto a low pass filter connected between said third line and said intermediate frequency output port having a high frequency cut off set to reject the local oscillator frequency.

9. The planar mixer set forth in claim 8 further comprising a high pass filter connected between said third line and said local oscillator input port having a low frequency cut off set to reject the intermediate frequency.

10. The planar mixer set forth in claim 9 wherein
said low pass filter has a cut off frequency set to reject the input signal.

11. The planar mixer set forth in claim 1 wherein
said substrate is of a semiconductor material suitable for the formation of active semiconductor devices and said diodes are formed integrally therein.

12. The planar mixer set forth in claim 11 wherein said substrate is of gallium arsenide.

* * * * *